United States Patent [19]

Wuchina

[11] Patent Number: 5,840,367
[45] Date of Patent: Nov. 24, 1998

[54] PROCESS FOR PREPARING A TWO PHASE $HFB_2$-$SIB_4$ MATERIAL

[75] Inventor: Eric J. Wuchina, Wheaton, Md.

[73] Assignee: The United States of America as represented by the Secretary of the Navy, Washington, D.C.

[21] Appl. No.: 825,151

[22] Filed: Mar. 26, 1997

Related U.S. Application Data

[62] Division of Ser. No. 669,673, Jun. 24, 1996, Pat. No. 5,691,258.

[51] Int. Cl.⁶ .................................................. C23C 16/38
[52] U.S. Cl. ...................................... 427/255.1; 427/255.2
[58] Field of Search ............................ 427/248.1, 255.1, 427/255.2

[56] References Cited

U.S. PATENT DOCUMENTS

| | | | |
|---|---|---|---|
| 3,979,500 | 9/1976 | Sheppard et al. | 423/289 |
| 4,022,872 | 5/1977 | Carson et al. | 423/297 |
| 5,149,514 | 9/1992 | Sanjuro | 427/255.2 |

Primary Examiner—Shrive P. Beck
Assistant Examiner—Timothy Meeks
Attorney, Agent, or Firm—John Forrest; Roger D. Johnson

[57] ABSTRACT

A chemical vapor deposition process comprising reacting $HfCl_4$ with $BCl_3$ and $SiCl_4$ with $BCl_3$ on a surface heated at 1100° C. to 1300° C. in a vacuum to produce a two phase $HfB_2$-$SiB_4$ ceramic coating on the surface, wherein the $HfCl_4$, $SiCl_4$, and $BCl_3$ reactants are deposited onto the heated surface from a vapor phase, and wherein $H_2$ is used to dissociate the $HfCl_4$, $SiCl_4$ and $BCl_3$ molecules.

8 Claims, 4 Drawing Sheets

PROCESS FOR PREPARING A TWO PHASE HFB$_2$-SIB$_4$ MATERIAL

This application is a division of pending application Ser. No. 08/669,673, filed Jun. 24, 1996, now U.S. Pat. No. 5,691,258.

BACKGROUND

This invention relates to ceramic coatings and more particularly to ceramic coatings containing metal borides.

Boride materials are known to have good oxidation resistance, with HfB$_2$ considered to be the best pure boride for oxidation applications. It has been shown that the addition of 10 to 20 percent SiC to HfB$_2$ increases the oxidation resistance.

The HfB$_2$-SiC materials are prepared by hot pressing powder mixtures. Hot pressing powder mixtures has limited ability to produce fine grained multiphase materials due to particle coarsening during the sintering process. Additionally, the purity of the final monolithic structure is limited to the purity of the starting powders.

Chemical vapor deposition (CVD) offers a method of producing highly pure multiphase ceramics, with better control of microstructure. Researchers have tried to produce HfB$_2$-SiC coatings by CVD but without success.

SUMMARY

Accordingly, an object of this invention is to provide a new ceramic material.

Another object of this invention is to provide a new high temperature oxidation resistant ceramic coating.

Yet another object of this invention is provide a new high purity, fine-grained, two phase ceramic coating.

These and other objects of this invention are accomplished by providing a two phase HfB$_2$-SiB$_4$ ceramic material comprising from more than zero to less than 100 mole percent HfB$_2$ with the remainder of the ceramic material being SiB$_4$.

The two phase HfB$_2$-SiB$_4$ ceramic material is useful as a high temperature oxidation resistant coating.

The two phase HfB$_2$-SiB$_4$ ceramic coating is produced by reacting (1) HfCl$_4$ with BCl$_3$ and (2) SiCl$_4$ with BCl$_3$ on a heated surface in a vacuum to produce the two phase HfB$_2$-SiB$_4$ coating on the surface.

BRIEF DESCRIPTION OF THE DRAWINGS

A more complete appreciation of the invention and many of its attendant advantages will be readily appreciated as the same becomes better understood by reference to the following description when considered in connection with the accompanying drawing wherein.

DESCRIPTION

Figure 1:
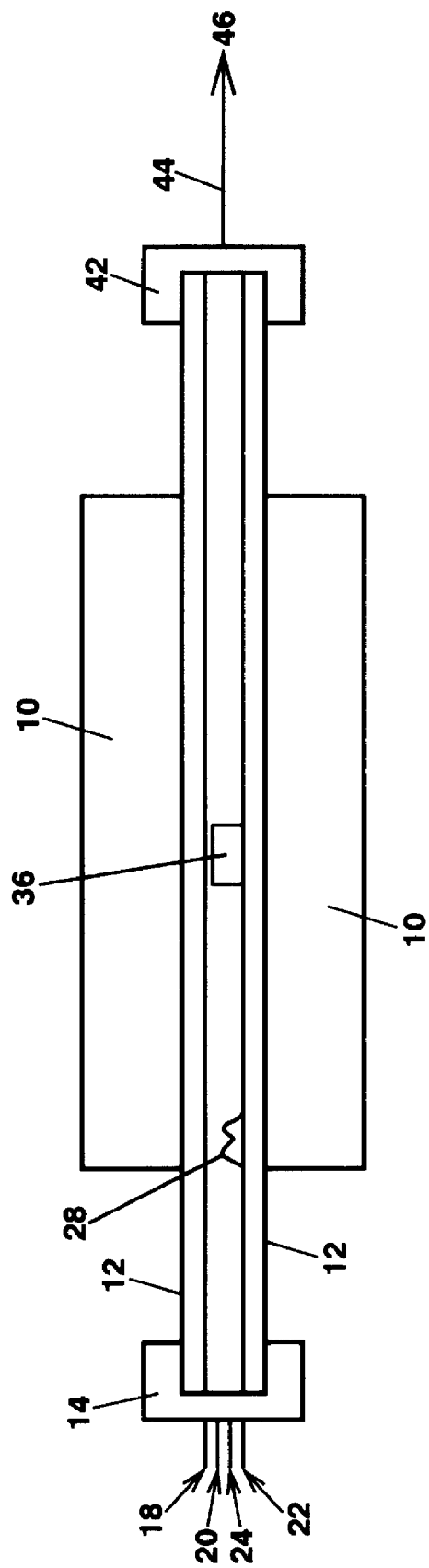
FIG. 1 is a sectional view of a chemical vapor deposition (CVD) system for preparing the material of this invention.

The present invention provides a new ceramic material that is a two phase HfB$_2$-SiB$_4$ ceramic material having a HfB$_2$ phase and a SiB$_4$ phase. The two phase HfB$_2$-SiB$_4$ ceramic material comprises from more than zero to less than 100, preferably from 50 to less than 100, more preferably from 60 to 90, and still more preferably from 70 to 80 mole percent HfB$_2$ with the remainder of the ceramic material being SiB$_4$. Preferably, the HfB$_2$ phase and the SiB$_4$ phase are uniformly distributed throughout the material. The major component phase forms a continuous phase or matrix into which the minor phase is dispersed. Finally, the grain sizes of the HfB$_2$ and the SiB$_4$ materials are preferably from about 1 to 10 microns. These are grain sizes that are typically produced by chemical vapor deposition processes.

The two phase HfB$_2$-SiB$_4$ ceramic materials of this invention can be used as high temperature oxidation resistant coatings to protect materials such as graphite, metals, or ceramics which are otherwise vulnerable to high temperature oxidation. The coating thickness is preferably from about 1 to about 1000 and more preferably from 10 to 300 microns.

The two phase HfB$_2$-SiB$_4$ ceramic materials of the present invention are prepared from H$_2$, HfCl$_4$, SiCl$_4$, and BCl$_3$ by a chemical vapor deposition process. The process is designed so that the reactions occur on the hot substrate surface and not in the vapor phase. For this to happen, the reactant molecules must diffuse through a flow boundary layer that forms in front of the substrate as a result of the flow of the gases through to vacuum reactor system. H$_2$ and preferably an excess of H$_2$ is used to strip chlorine from the HfCl$_4$, SiC$_4$, and BCl$_3$ to increase the reactivity of these compounds. HfCl$_4$ reacts with BCl$_3$ to produce HfB$_2$ and SiCl$_4$ reacts with BCl$_3$ to produce SiB$_4$. If the HfCl$_4$ and the SiCl$_4$ are thoroughly mixed in the vapor phase, the HfB$_2$ phase and the SiB$_4$ phase will be uniformly distributed throughout the ceramic material produced on the surface of the substrate or object being coated. The stoichiometry of the two reactions can be represented as follows:

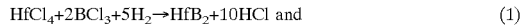
HfCl$_4$+2BCl$_3$+5H$_2$→HfB$_2$+10HCl and (1)

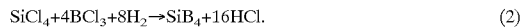
SiCl$_4$+4BCl$_3$+8H$_2$→SiB$_4$+16HCl. (2)

The relative amount of HfB$_2$ to SiB$_4$ in the two phase HfB$_2$-SiB$_4$ ceramic material is a function of (1) the ratio of the concentration of HfCl$_4$ to the concentration of SiCl$_4$ in the vapor phase, (2) the ratio of the diffusion rate of HfCl$_4$ to the diffusion rate of SiCl$_4$ through the flow boundary layer, and (3) the kinetics of the deposition reactions shown in equations (1) and (2).

The concentrations of HfCl$_4$ and SiCl$_4$ in the vapor phase are easy to control and adjust. However, the diffusion rates and reaction kinetics are difficult to determine and vary with changing process conditions. Therefore, a preferred procedure is to assume that the diffusion rates of HfCl$_4$ and SiCl$_4$ are the same and that the reaction kinetics for the reactions of equations (1) and (2) are the same. The ratio of the molar concentration of HfCl$_4$ to the molar concentration of SiCl$_4$ in the vapor phase is adjust to be the same as the molar ratio of HfB$_2$ to SiB$_4$ desired in the two phase HfB$_2$-SiB$_4$ ceramic material product. A sample product is then prepared and its composition is analyzed by spectroscopy. The ratio of HfCl$_4$ to SiCl$_4$ in the vapor phase is then adjusted to correct the composition of the two phase HfB$_2$-SiB$_4$ product.

The stoichiometric amount of BCl$_3$ needed is calculated from the amounts of HfCl$_4$ and SiCl$_4$ used according to equations (1) and (2). A stoichiometric excess of BCl$_3$ is preferably used to assure a sufficient amount of boron to react with all of the HfCl$_4$ and all of the SiCl$_4$.

Specifically, this assures that the slower reacting compound will have all of the boron it needs readily available.

The unreacted, excess $BCl_3$ is removed from the system with the HCl and other waste gases. Thus, the excess $BCl_3$ does not contaminate the product.

The ratio of the moles of $H_2$ used to the total number of moles of $HfCl_4$, $SiCl_4$, and $BCl_3$ ($N_{total}=N_{HfCl_4}+N_{SiCl_4}+N_{BCl_3}$) is preferably from 1:1 to 50:1, more preferably from 5:1 to 30:1, and still more preferably from 10:1 to 20:1. Enough $H_2$ is used to achieve sufficient dissociation of the $HfCl_4$, $SiCl_4$, and $BCl_3$ reactants to efficiently produce the two phase $HfB_2$-$SiB_4$ ceramic material. However, care is taken to avoid using too much $H_2$ which will produce undesirable metallic deposits.

The substrate temperature (the reaction temperature) is preferably from 1100° to 1300° C. Temperatures above 1300° C. are too high for $SiB_4$ deposition, and the deposition rate is prohibitively slow at temperatures below 1100° C.

Figure 2:
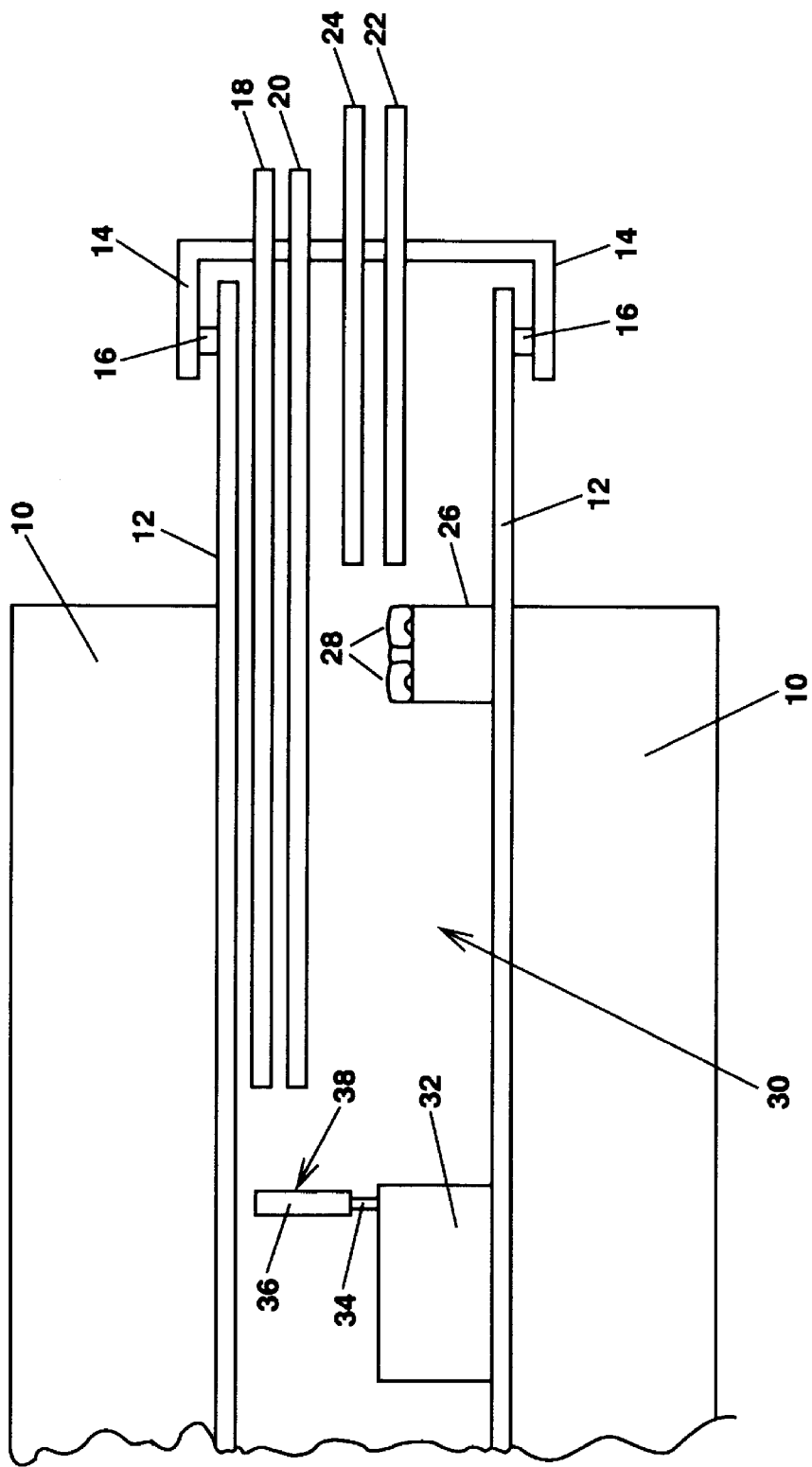
FIG. 2 is a more detailed sectional view of the front portion of the CVD system where the reactions occur.

FIGS. 1 and 2 provide a cross-sectional view of a typical apparatus for the formation of the two phase $HfB_2$-$SiB_4$ ceramic material by chemical vapor deposition (CVD). FIG. 1 provides an overall sectional view of the apparatus. Shown is the tube furnace 10 into which a large ceramic tube 12 is inserted. Both ends of the tube 12 extends beyond the furnace 10. Vacuum fittings 14 and 42 close off both ends of the ceramic tube 12. Shown are a $H_2$ injector 18, a $BCl_3$ injector 20, a $Cl_2$ injector 22, and a $SiCl_4$ injector 24 which are inserted through the vacuum fitting 14 into the ceramic tube 12. FIG. 1 also show the relative positions of the hafnium sponge 28 which reacts with the $Cl_2$ to produce $HfCl_4$, the substrate 36 which is to be coated, and the exhaust line 44 which is inserted through the vacuum fitting 42 into the ceramic tube 12. The exhaust line 44 is hooked up to a vacuum system 46.

FIG. 2 shows a more detailed cross-sectional view of the front portion of the CVD apparatus. Shown are the tube furnace 10 and the ceramic tube 12. The ceramic tube 12 is generally made of alumina or mullite. A stainless steel vacuum fitting 14 closes off the end of the ceramic tube 10 with a fluorinated rubber (e.g., VITON) o-ring 16 providing a vacuum seal. The hafnium sponge 28 is support by a first block 26 at the end of the tube furnace 10. In this position the hafnium sponge is kept at about 400° C., a temperature at which it readily reacts with $Cl_2$ to produce $HfCl_4$. The substrate 36 is shown supported by a holder 34 which is supported by a second block 32. The substrate 36 is positioned at a point in the tube furnace 10 where the temperature of the substrate 36 will be the desired reaction temperature in the range of from about 1100° C. to about 1300° C. Chlorine gas ($Cl_2$) passes through the $Cl_2$ injector 22 which is positioned so that the $Cl_2$ passes over the hot hafnium sponge and reacts to produce the $HfCl_4$. The $SiCl_4$ passes through the $SiCl_4$ injector 24 so that the $SiCl_4$ flows over or near the hafnium sponge 28. The $SiCl_4$ does not react with the hafnium sponge 28. However, injecting the $SiCl_4$ in the same place as the $Cl_2$ results in the $SiCl_4$ and the $HfCl_4$ being thoroughly mixed as they travel from the hafnium sponge 28 through the region 30 to the substrate 36. The $BCl_3$ passes through the $BCl_3$ injector 20 where it is kept isolated until it is released just in front of the substrate 36. This is done to prevent reactions between the $BCl_3$ and $SiCl_4$ and $HfCl_4$ in the vapor phase. Similarly, the $H_2$ passes through the $H_2$ injector 18 where it is kept isolated until it is released just in front of the substrate 36. This too is done to prevent vapor phase reactions. Finally, a flow boundary layer 38 forms in front of the substrate 36 as a result of the flow of gases through the system during the process. The reactants must diffuse through this flow boundary layer 38 to reach the substrate 36 where the reactions occur.

Referring again to FIG. 1, the HCl waste product and any unreacted materials (e.g., excess $BCl_3$ and $H_2$) flow past the substrate 36 and out the exhaust line 44 to the vacuum system 46.

The general nature of the invention having been set forth, the following examples are presented as specific illustrations thereof. It will be understood that the invention is not limited to these specific examples but is susceptible to various modifications that will be recognized by one of ordinary skill in the art.

EXAMPLE 1

Uniform two phase $HfB_2$-$SiB_2$ coating

Figure 3:
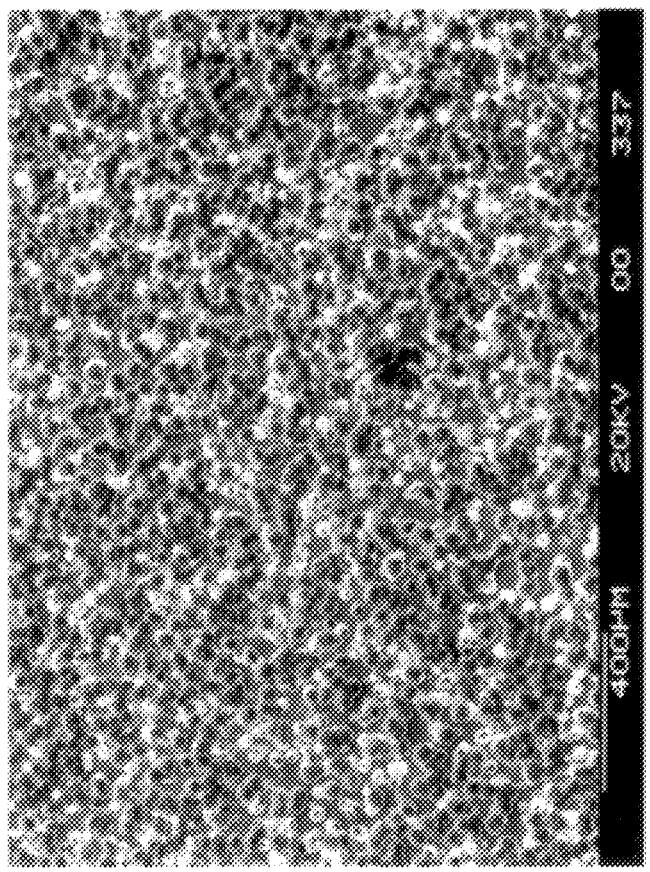
FIG. 3 is a SEM micrograph of a uniform two phase HfB$_2$-SiB$_4$ ceramic coating which is discussed in example 1.

The equipment used is the same as shown in FIGS. 1 and 2. The vacuum chamber is enclosed by the large ceramic tube 12 and stainless steel vacuum fitting 14 and 42. Fluorinated rubber (e.i., VITON) o-rings 16 provide a vacuum seal between the ceramic tube 12 and the stainless steel vacuum fittings 14 and 42. The total system pressure was maintained at 40 Torr. The graphite substrate 36, which was to be coated, was kept at 1200° C. and a hafnium sponge 32 was kept at about 400° C. Gas flow was begun after the pressure and temperature (substrate and Hafnium sponge) had reached equilibrium. First, $H_2$ flow was started at 2000 sccm (standard cm$^3$/minute) through the $H_2$ injector 18 which released the $H_2$ 1 inch from the graphite substrate 36. After subsequent pressure fluctuations subsided, $Cl_2$ (20 sccm), $SiCl_4$ (10 sccm), and $BCl_3$ (70 sccm) flows were begun. The $Cl_2$ flowed through the $Cl_2$ injector 22 and was released in front of the hafnium sponge 32 so that the $Cl_2$ flowed over the hafnium sponge with which it reacted to produce a flow of $HfCl_4$ (10 sccm). Note the flow of $HfCl_4$ is half that of $Cl_2$ according to the equation $Hf_{(s)}+2Cl_{2(g)} \rightarrow HfCl_{4(g)}$. The $SiCl_4$ flowed through a $SiCl_4$ injector 24 and was released at the same place as the $Cl_2$ which was 10 inches from the graphite substrate 36. The $SiCl_4$ and $HfCl_4$ flowed together and were thoroughly mixed by the time they reached the graphite substrate. The $BCl_3$ flowed through the $BCl_3$ injector 20 and was released 1 inch from the graphite substrate 36. After 70 minutes of deposition time, the gas flows were shut off, and the system was slowly cooled to room temperature. FIG. 3 is a scanning electron microscope (SEM) micrograph of the two phase $HfB_2$-$SiB_4$ coating produced in this example. The product is a uniform two phase $HfB_2$-$SiB_4$ coating.

EXAMPLE 2

Nonuniform two phase $HfB_2$-$SiB_4$ coating

Figure 4:
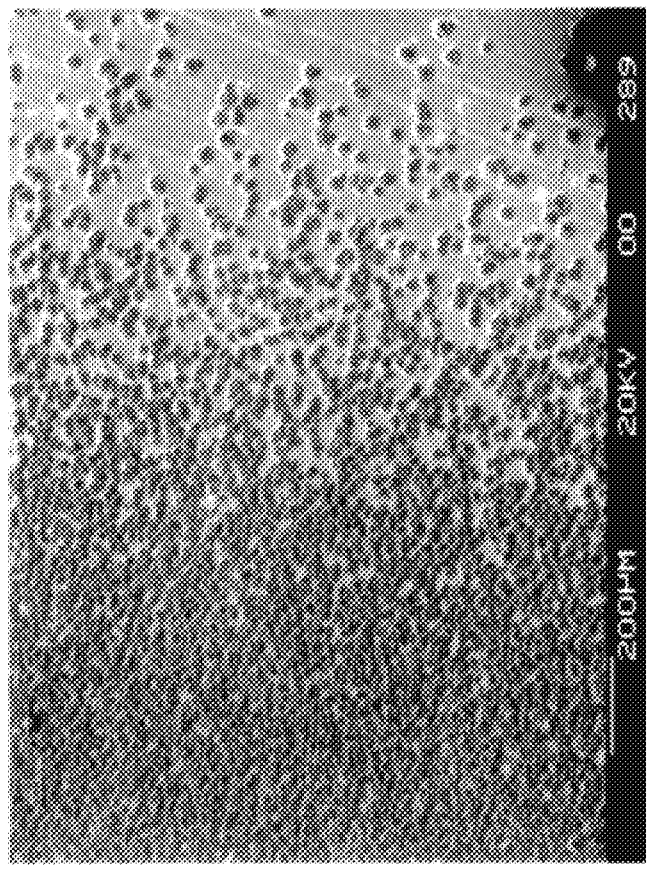
FIG. 4 is a SEM micrograph of a nonuniform two phase HfB$_2$-SiB$_4$ ceramic coating which is discussed in example 2.

The conditions were the same as in example 1 except that the positions of the $H_2$ and $SiCl_4$ injectors (18 and 24) were reversed. The $H_2$ was released 10 inches from the graphite substrate 36 and the $SiB_4$ was released 1 inch from the graphite substrate. In this manner, the $SiCl_4$ bypassed the Hf chlorination zone (Hafnium sponge 28) and the $HfCl_4$ and $SiCl_4$ were not thoroughly mixed before reaching the graphite substrate. After 70 minutes of deposition time, the gas flows were shut off, and the system was slowly cooled to room temperature. FIG. 4 is a SEM micrograph of the two phase $HfB_2$-$SiB_4$ coating produced in this example. The SEM micrograph shows 3 distinct regions: a light colored region, a dark region, and a mix of dark grains on a light region. The dark region is a continuous $SiB_4$ coating, while the light region is $HfB_2$. In the mixed region, dark $SiB_4$ crystals exist in a continuous light-colored $HfB_2$ matrix. In this manner, a two phase coating was achieved, but the distribution of phases was not uniform across the substrate surface. This is a result of the poor mixing of $HfCl_4$ and $SiCl_4$ in the gas phase.

A wide variety of deposition conditions were used in the study of the two-phase deposition. It was eventually found that the deposition conditions leading to the codeposition of $HfB_2$ and $SiB_4$ were quite narrow. The preferred temperature range for the substrate (or object) being coated is from about 1100° to about 1300° C. The preferred range for the total system pressure is from about 20 to about 40 Torr. The variables of temperature and pressure, factors that usually influence deposition rate and coating morphology, were not sufficiently different at the high and low extremes of these ranges to substantially change the coating characteristics. The most significant factor affecting the coating morphology and uniformity, however, was the position of the gas injectors during the experiment. In example 1 where the $SiCl_4$ injector was positioned so that $HfCl_4$ and $SiCl_4$ were thoroughly mixed in the gas phase, a uniform two phase $HfB_2$-$SiB_4$ coating was produced (see FIG. 3). However, in example 2 where the $SiCl_4$ injector was placed so that poor mixing of $HfB_2$ and $SiB_4$ occurred in the gas phase, the resulting coating was nonuniform (see FIG. 4). Finally, it was found that varying the relative amount of $HfCl_4$ and $SiCl_4$ did change the amounts of $HfB_2$ and $SiB_4$ in the coating.

Obviously, other modifications and variations of the present invention may be possible in light of the foregoing teachings. It is therefore to be understood that within the scope of the appended claims the invention may be practiced otherwise than as specifically described.

What is claimed is:

1. A steady state flow chemical vapor deposition process comprising:

directing the following gas streams at a surface being coated (a) a stream of a mixture of $HfCl_4$ and $SiCl_4$, (b) a stream of $BCl_3$, and (c) a stream of $H_2$, wherein the streams (a), (b), and (c) are kept separate until they reach the surface where they mix and the $HfCl_4$ reacts with the $BCl_3$ and the $SiCl_4$ reacts with the $BCl_3$ on the surface to produce a two phase $HfB_2$-$SiB_4$ ceramic coating on the surface, and wherein the surface being coated is kept at a temperature of from 1100° C. to 1300° C. and the total system pressure is kept at from 20 to 40 Torr.

2. The process of claim 1 wherein the ratio of the moles of $H_2$ to the total number of moles of $HfCl_4$, $SiCl_4$, and $BCl_3$ is from 1:1 to 50:1.

3. The process of claim 2 wherein the ratio of the moles of $H_2$ to the total number of moles of $HfCl_4$, $SiCl_4$, and $BCl_3$ is from 5:1 to 30:1.

4. The process of claim 3 wherein the ratio of the moles of $H_2$ to the total number of moles of $HfCl_4$, $SiCl_4$, and $BCl_3$ is from 10:1 to 20:1.

5. The process of claim 1 wherein the $HfCl_4$ and $SiCl_4$ are mixed in the vapor phase before being deposited on the surface to provide a uniform coating.

6. The process of claim 5 wherein the ratio of the moles of $H_2$ to the total number of moles of $HfCl_4$, $SiCl_4$, and $BCl_3$ is from 1:1 to 50:1.

7. The process of claim 6 wherein the ratio of the moles of $H_2$ to the total number of moles of $HfCl_4$, $SiCl_4$, and $BCl_3$ is from 5:1 to 30:1.

8. The process of claim 7 wherein the ratio of the moles of $H_2$ to the total number of moles of $HfCl_4$, $SiCl_4$, and $BCl_3$ is from 10:1 to 20:1.

* * * * *